United States Patent
Lee et al.

(10) Patent No.: US 9,576,949 B2
(45) Date of Patent: Feb. 21, 2017

(54) DIODE FORMED OF PMOSFET AND SCHOTTKY DIODES

(75) Inventors: Jam-Wem Lee, Zhubei (TW); Wan-Yen Lin, Kaohsiung (TW); Ming-Hsiang Song, Shin-Chu (TW); Cheng-Hsiung Kuo, Jubei (TW); Yue-Der Chih, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 102 days.

(21) Appl. No.: 13/604,299

(22) Filed: Sep. 5, 2012

(65) Prior Publication Data

US 2014/0062580 A1    Mar. 6, 2014

(51) Int. Cl.
| | |
|---|---|
| *H01L 29/66* | (2006.01) |
| *H01L 27/07* | (2006.01) |
| *H01L 27/02* | (2006.01) |
| *H01L 29/872* | (2006.01) |
| *H01L 29/06* | (2006.01) |
| *H02M 3/07* | (2006.01) |

(52) U.S. Cl.
CPC ....... *H01L 27/0727* (2013.01); *H01L 27/0222* (2013.01); *H01L 29/0619* (2013.01); *H01L 29/872* (2013.01); *H02M 3/07* (2013.01)

(58) Field of Classification Search
CPC ... H01L 29/872; H01L 27/0222; H01L 31/108
USPC ................ 257/476, 299, 449, 453, 454, 471
See application file for complete search history.

(56) References Cited

U.S. PATENT DOCUMENTS

| | | | | |
|---|---|---|---|---|
| 5,525,829 | A * | 6/1996 | Mistry | 257/473 |
| 5,589,697 | A * | 12/1996 | Smayling et al. | 257/204 |
| 6,184,741 | B1 * | 2/2001 | Ghilardelli | G11C 5/145 |
| | | | | 327/536 |
| 6,617,642 | B1 * | 9/2003 | Georgescu | H01L 27/0727 |
| | | | | 257/335 |
| 6,683,362 | B1 * | 1/2004 | O et al. | 257/471 |
| 7,052,945 | B2 * | 5/2006 | Snyder | 438/197 |
| 8,325,042 | B1 * | 12/2012 | Hyde et al. | 340/572.1 |
| 8,362,570 | B2 * | 1/2013 | Larrieu et al. | 257/382 |
| 8,513,765 | B2 * | 8/2013 | Cheng et al. | 257/486 |
| 2006/0013047 | A1 * | 1/2006 | Sudou | G11C 5/145 |
| | | | | 365/189.09 |
| 2006/0133176 | A1 * | 6/2006 | Kim | 365/226 |
| 2006/0220115 | A1 * | 10/2006 | Otake | 257/335 |
| 2006/0244534 | A1 * | 11/2006 | Whittaker | 330/285 |

(Continued)

OTHER PUBLICATIONS

Fairchild Semiconductor Corporation, AN-600, "Understanding Latch-up in Advanced CMOS Logic", Application Note Jan. 1989, Revised Apr. 1999, 4 pages.

*Primary Examiner* — Phat X Cao
*Assistant Examiner* — Mohammad M Hoque
(74) *Attorney, Agent, or Firm* — Slater Matsil, LLP

(57) ABSTRACT

A P-type Metal-Oxide-Semiconductor Field Effect Transistor (PMOSFET) includes a gate, a first source/drain region connected to the gate, and a second source/drain region on an opposite side of the gate than the first source/drain region. A first Schottky diode includes a first anode connected to the first source/drain region, and a first cathode connected to a body of the PMOSFET. A second Schottky diode includes a second anode connected to the second source/drain region, and a second cathode connected to the body of the PMOSFET.

20 Claims, 2 Drawing Sheets

(56) References Cited

U.S. PATENT DOCUMENTS

| | | | | |
|---|---|---|---|---|
| 2006/0246680 A1* | 11/2006 | Bhattacharyya | | 438/400 |
| 2007/0057347 A1* | 3/2007 | Ikeda | | 257/616 |
| 2007/0127182 A1* | 6/2007 | Chang et al. | | 361/100 |
| 2007/0252211 A1* | 11/2007 | Yagishita | | 257/351 |
| 2008/0064156 A1* | 3/2008 | Ikeda | | 438/199 |
| 2008/0149983 A1* | 6/2008 | Rassel et al. | | 257/312 |
| 2009/0201280 A1* | 8/2009 | Huang | | 345/211 |
| 2009/0315598 A1* | 12/2009 | Namekawa | | 327/157 |
| 2011/0045663 A1* | 2/2011 | Ikeda | | 438/519 |
| 2011/0049624 A1* | 3/2011 | Guo et al. | | 257/347 |
| 2011/0223727 A1* | 9/2011 | Ko et al. | | 438/213 |
| 2011/0298526 A1* | 12/2011 | Homol et al. | | 327/437 |

* cited by examiner

DIODE FORMED OF PMOSFET AND SCHOTTKY DIODES

BACKGROUND

Dickson charge pump is a DC-to-DC converter that takes an input DC voltage, and generates an output DC voltage higher than the input DC voltage. The output DC voltage is a multiplication of the input DC voltage. In addition to the DC input voltage, the circuit requires a clock signal or a pair of complementary clock signal, wherein the amplitude of the clock signal is multiplied to increase the output DC voltage.

Dickson charge pump may include a plurality of stages, each used to push up the voltage generated by the previous stages. Each of the stages may include a diode. Conventionally, the diode was formed of a P-type Metal-Oxide-Semiconductor Field Effect Transistor (PMOSFET) that has one of its source and drain regions as an input node, and the other one of the source and drain regions as the output node. The gate of the PMOSFET is tied to the output node of the PMOSFET. The diode, however, suffers from leakage currents between its body and the substrate, on which the diode is formed. The leakage current causes voltage drop in the output DC voltage. As a result, more stages may be needed to bring the output voltage up to a desirable value.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A low-leakage diode and a Dickson charge pump comprising the low-leakage diode are provided in accordance with various exemplary embodiments. The variations and the operation of the diode and the Dickson charge pump are discussed. Throughout the various views and illustrative embodiments, like reference numbers are used to designate like elements. Although the Dickson charge pump is used as an example to explain the concepts of the embodiments, the low-leakage diode may be used in other circuits such as other types of charge pumps in which diodes are used.

Figure 1:
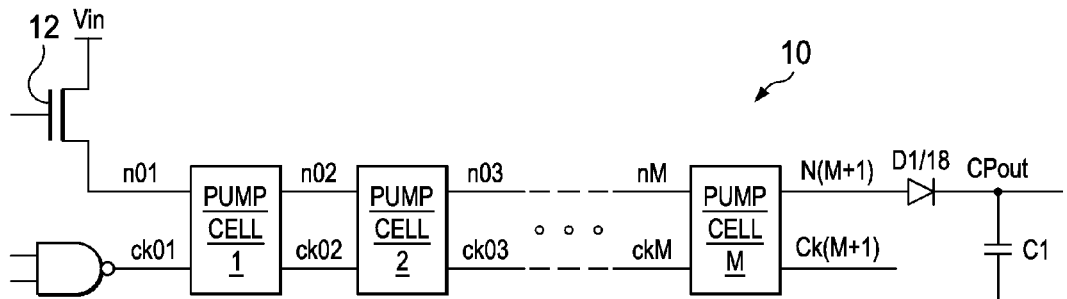
FIG. 1 illustrates a schematic circuit diagram of a Dickson charge pump in accordance with exemplary embodiments, wherein the Dickson charge pump includes a plurality of pump cells connected in series.
Figure 2:
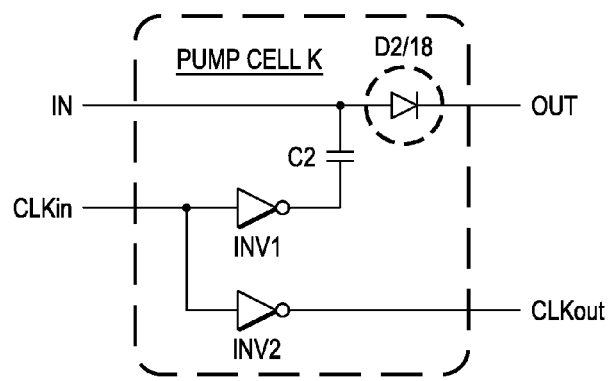
FIG. 2 illustrates an exemplary pump cell of the Dickson charge pump.

FIG. 1 illustrates a block diagram of exemplary Dickson charge pump 10, which includes switch 12 for connecting input voltage Vin to the input of a plurality of serially connected pump cells, namely pump cell 1 though pump cell M. Integer "M" may be any positive integer. The plurality of charge pump cells 1 through M form a plurality of stages, each configured to push up the received voltage to a higher level, and pass the higher voltage to the next stage. For example, the output of each of the stages may be greater than the respective input by Vin, wherein Vin may be the amplitude of the clock signals on nodes ck01 though ckM. It is appreciated that although in the exemplary embodiments, the amplitude of the clock signals is equal to the input voltage Vin that is connected to switch 12, the amplitude may be different from input voltage Vin in alternative embodiments. There are various implementations of the charge pump cells, wherein FIGS. 1 and 2 illustrate one of the implementations in accordance with exemplary embodiments.

Each of pump cells 1 through M includes a voltage input node and a voltage output node, wherein the voltage input node of each of pump cells 1 through M is connected to the voltage output node of the previous stage. The voltage input nodes and the voltage output nodes are indicated as n01 through n(M+1). Furthermore, each of pump cells 1 through M includes a clock input node and a clock output node, wherein the clock input node of each of pump cells 1 through M is connected to the clock output node of the previous stage. The clock input nodes and the clock output nodes are indicated as ck01 through ck(M+1). In accordance with some embodiments, diode D1 is coupled between voltage output node n(M+1) and the output node CPout of charge pump 10.

The plurality of pump cells 1 through M may be identical to each other. FIG. 2 illustrates an exemplary pump cell K, may be any of the pump cells 1 through M. Pump cell K includes diode D2, capacitor C2 connected to diode D2, and inverters INV1 and INV2. Diode D2 receives an input voltage from its voltage input node IN, and outputs a voltage to its output node OUT, wherein voltage input node IN and voltage output node OUT may be any of n01, n02 . . . n(M+1) (FIG. 1), depending the position of pump cell K in the plurality of stages. Inverter INV1 inverts the clock signal received from clock input node CLKin, and outputs an output clock signal to its clock output node CLKout, wherein clock input node CLKin and clock output node CLKout may be any of nodes ck01, ck02 . . . ck(M+1) (FIG. 1), depending the position of pump cell K in the plurality of stages. The input clock signal received from clock input node CLKin and the clock signal outputted to clock output node CLKout may have an amplitude equal to, or different from, Vin.

Assuming at the beginning of the operation of charge pump 10, the input clock signal received from clock input node CLKin is 0 V, and the voltage on voltage input node IN is Vin. When the input clock signal at clock input node CLKin goes high to Vin, the top plate of capacitor C2 is pushed up to 2 Vin. Diode D2 is then turned off (reversely biased) and diode D2 of the next stage (as shown in FIG. 1) is turned on to charge the capacitor C2 of the next stage to 2 Vin. During the subsequent clock cycle of the clock signals, the next stage of pump cells further pushes the input voltage of 2 Vin up to generate output voltage, which is equal to 3 Vin. Generally, each of the stages pushes voltage up by Vin (the amplitude of the clock signal). Diode D1 and capacitor C1 (FIG. 1) may smooth the output voltage, which is outputted to output node CPout (FIG. 1) of charge pump 10. In some embodiments, the output voltage is equal to Vin multiplied by integer (M+1), although the output voltage may be different if the amplitude of the clock signals is different from input voltage Vin.

Figure 3:
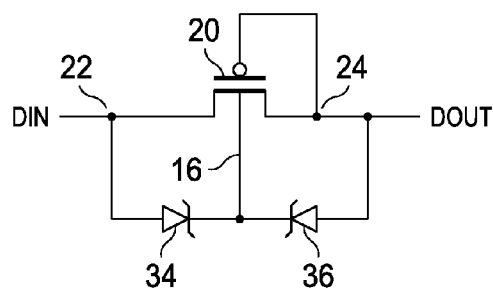
FIG. 3 illustrates a circuit diagram of a diode used in the Dickson charge pump.

FIG. 3 illustrates an exemplary circuit diagram of diode 18, whose structure may be adopted by diode D1 (FIG. 1) and/or diode D2 (FIG. 2) inside pump cells 1 through M (FIG. 1). Diode 18 includes P-type Metal-Oxide-Semiconductor Field Effect Transistor (PMOSFET) 20, and Schottky diodes 34 and 36. Diode 18 further includes voltage input node DIN (refer to FIG. 2), which is connected to a first one of the source/drain regions of PMOSFET 20. Throughout the description, the term "source/drain" is used to represent either the source or the drain, depending on the role of the respective region. Diode 18 further includes voltage output node DOUT, which is connected to a second one of the source/drain regions and the gate of PMOSFET 20. Schottky diode 34 includes an anode connected to voltage input node DIN, and a cathode connected to body 16 of PMOSFET 20. Schottky diode 36 includes an anode connected to voltage output node DOUT, and a cathode connected to body 16 of PMOSFET 20.

Figure 4:
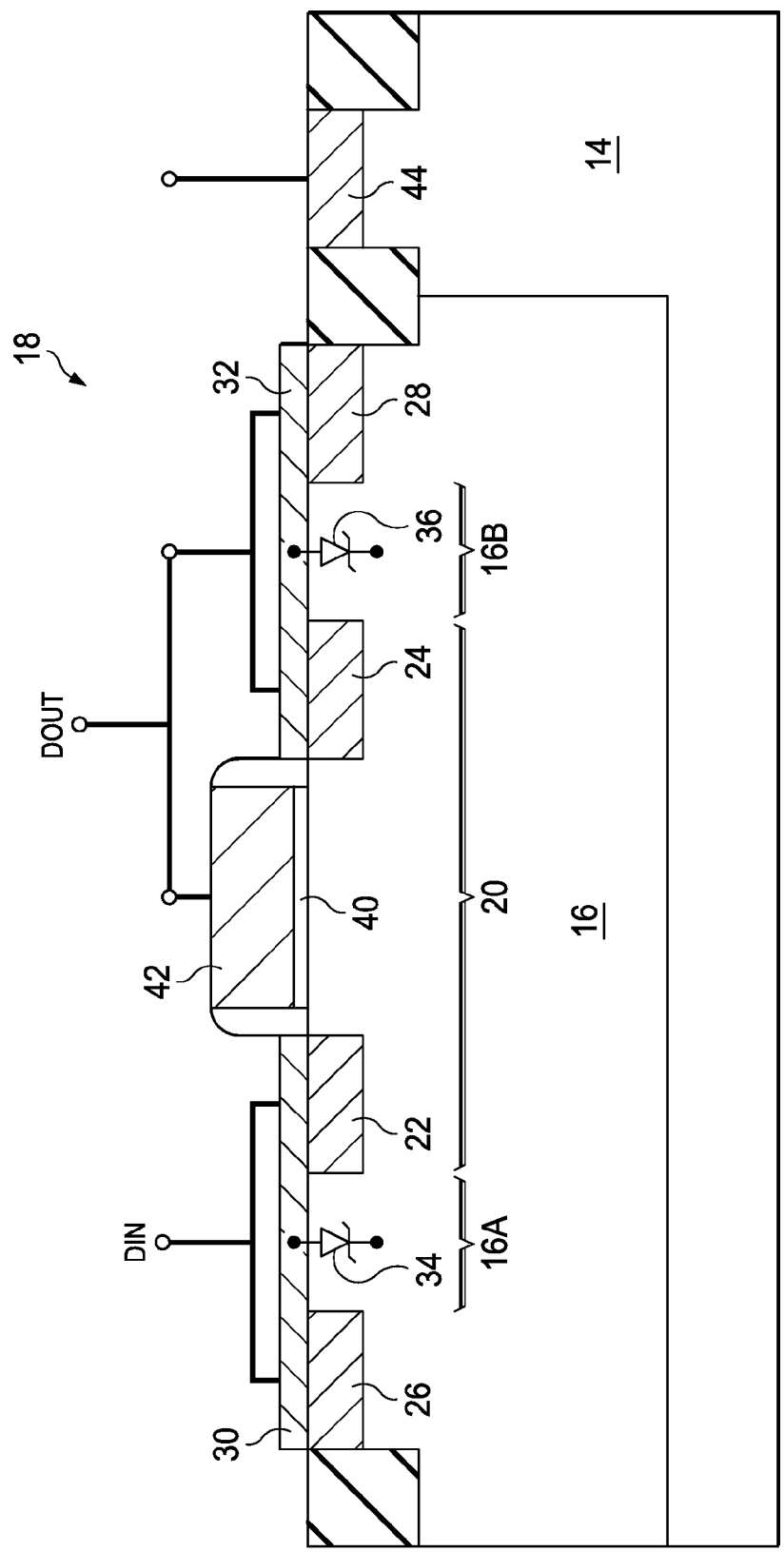
FIG. 4 illustrates a cross-sectional view of the diode used in the Dickson charge pump.

FIG. 4 illustrates the cross-sectional view of diode 18 in accordance with exemplary embodiments. The illustrated diode 18 is formed at a surface of Shallow N-well (SHN) region 16, which is further formed in p-type substrate 14. In some exemplary embodiments, SHN region 16 has an n-type impurity concentration between about $1 \times 10^{16}/cm^3$ and about $1 \times 10^{17}/cm^3$, although different impurity concentrations may be used.

PMOS transistor 20 includes gate dielectric 40 over SHN region 16, and gate electrode 42 over gate dielectric 40. Source/drain regions 22 and 24 are formed in SHN region 16, and are disposed on the opposite sides of gate dielectric 40 and gate electrode 42. Source/drain regions 22 and 24 may be heavily doped p-type (p+) regions, which may have a p-type impurity concentration between about $1 \times 10^{19}/cm^3$ and about $1 \times 10^{21}/cm^3$, for example. Gate electrode 42 is connected to source/drain region 24. P+ region 26 is adjacent to source/drain region 22, with a portion of SHN region 16 therebetween, which portion is referred to portion 16A hereinafter. Metal-containing plate 30 is over and contacting portion 16A of SHN region 16, so that Schottky diode 34 is formed. Metal-containing plate 30 may act as, or connect to, input node DIN. Metal-containing plate 30 forms the anode of Schottky diode 34, and portion 16A of SHN region 16 forms the cathode of Schottky diode 34. In some exemplary embodiments, metal-containing plate 30 is formed of a metal or a metal alloy comprising aluminum, tungsten, nickel, cobalt, copper, and/or the like. In alternative embodiments, metal-containing plate 30 comprises a metal silicide. Metal-containing plate 30 may further extend over and contacting p+ regions 22 and 26 in accordance with some embodiments, for example, when metal-containing plate 30 are metal silicide plates. In the resulting structure, the anode of Schottky diode 34 is shorted to source/drain region 22. The cathode of Schottky diode 34 is connected to SHN region 16, which is the body of PMOSFET 20.

Similarly, p+ region 28 is adjacent to source/drain region 24, with a portion of SHN region 16 therebetween, which portion is referred to portion 16B hereinafter. Metal-containing plate 32 is over and contacting portion 16B of SHN region 16, so that Schottky diode 36 is formed. Metal-containing plate 32 may act as, or connect to, input node DOUT. Metal-containing plate 32 forms the anode of Schottky diode 36, and portion 16B forms the cathode of Schottky diode 36. Metal-containing plate 32 may be formed of a same material as metal-containing plate 30. Metal plate 32 may further extend over and contacting p+ regions 24 and 28. In the resulting structure, the anode of Schottky diode 36 is shorted to source/drain region 24. The cathode of Schottky diode 36 is also connected to SHN region 16, which is the body of PMOSFET 20. In the structure shown in FIG. 4, p+ region 44 is also formed in substrate 14 to act as the pickup region of substrate 14.

In the operation of diode 18, assuming in a specific period of time, voltage input node DIN is connected to a high voltage, Schottky diode 34 is thus forward biased. Accordingly, through Schottky diode 34, the logic high voltage is passed to SHN region 16, which is the body of PMOSFET 20. Further assuming in a second period of time, voltage output node DOUT is connected to a logic high voltage, Schottky diode 36 is thus forward biased. Accordingly, through Schottky diode 36, the logic high voltage is passed to SHN region 16 through Schottky diode 36, which is the body of PMOSFET 20. As a result, regardless of which of input node DIN and voltage output node DOUT is at the voltage higher than the other one of input node DIN and voltage output node DOUT, the logic high voltage is passed to body 16 of PMOSFET 20. This prevents the voltage of body 16 of PMOSFET 20 to be too low to cause the diode formed of p-type substrate 14 and SHN region 16 to be forward biased. Accordingly, the leakage current between SHN region 16 and p-type substrate 14 is prevented.

In the embodiments, through Schottky diodes 34 a nd 36, the body region 16 of the PMOSFET 20 is always tied to the higher one of the voltages on nodes DIN and DOUT, regardless of the operation status of diode 18. Therefore, the resulting diode 18 has a low leakage current. The charge pump adopting diode 18 thus has smaller voltage lost and a smaller power lost. Simulation results have reviewed that the Dickson charge pumps in accordance with embodiments have a power efficiency equal to about 6.06 percent.

As a comparison, to solve the leakage problem, in conventional solutions, two additional PMOSFETs, which are known as bulk switches, were added. The first additional PMOSFET has its gate connected to the input node of a diode formed of a P-type Metal-Oxide-Semiconductor Field Effect Transistor (PMOSFET), one of the source and drain regions connected to the output node, and the other one of the source and drain regions connected to the body of the PMOSFET that forms the diode. The second additional PMOSFET has its gate connected to the output node, one of the source and drain regions connected to the input node, and the other one of the source and drain regions connected to the body of the PMOSFET that forms the diode. The two additional PMOSFETs are turned off whenever needed to turn off the current path of the leakage current. The introduction of the two additional PMOSFETs, however, results in the reduction in the pumping speed of the Dickson charge pump. The conventional Dickson charge pump that includes diodes-comprising bulk switches have a power efficiency equal to about 3.27 percent, which is significantly lower than the power efficiency (about 6.06 percent) of the Dickson charge pumps in accordance with embodiments.

In accordance with embodiments, a PMOSFET includes a gate, a first source/drain region connected to the gate, and a second source/drain region on an opposite side of the gate than the first source/drain region. A first Schottky diode includes a first anode connected to the first source/drain region, and a first cathode connected to a body of the PMOSFET. A second Schottky diode includes a second anode connected to the second source/drain region, and a second cathode connected to the body of the PMOSFET.

In accordance with other embodiments, a device includes a semiconductor substrate, an n-well region in the semiconductor substrate, and a PMOSFET. The PMOSFET includes a gate dielectric over the n-type well region, a gate electrode over the gate dielectric, a first source/drain region in the n-type well region and on a first side of the gate electrode, and a second source/drain region in the n-type well region and on a second side of the gate electrode. A first metal-containing plate is disposed over and connected to the first source/drain region. The first metal-containing plate extends over and contacts a first portion of the n-type well region to form a first Schottky diode with the n-type well region. A second metal-containing plate is disposed over and connected to the second source/drain region. The second metal-containing plate extends over and contacts a second portion of the n-type well region to form a second Schottky diode with the n-type well region.

In accordance with yet other embodiments, a device includes a Dickson charge pump including a pump cell. The first pump cell includes a capacitor and a PMOSFET. The PMOSFET includes a gate, a first source/drain region in a body region of the PMOSFET and connected to the gate, and a second source/drain region in the body region. One of the first and the second source/drain regions is electrically connected to the capacitor. The pump cell further includes a first Schottky diode including a first anode connected to the first source/drain region, and a first cathode connected to the body region of the PMOSFET. The pump cell further includes a second Schottky diode, which includes a second anode connected to the second source/drain region, and a second cathode connected to the body region of the PMOSFET.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
a semiconductor substrate;
an n-type well region in the semiconductor substrate;
a P-type Field Effect Transistor (PFET) comprising:
 a gate;
 a first source/drain region electrically connected to the gate;
 a second source/drain region on an opposite side of the gate than the first source/drain region, the second source/drain region not being electrically connected to the gate;
a first Schottky diode comprising:
 a first anode connected to the first source/drain region; and
 a first cathode connected to the n-type well region, the first source/drain region being disposed between at least a portion of the first cathode and a region of the semiconductor substrate directly under the gate; and
a second Schottky diode comprising:
 a second anode connected to the second source/drain region; and
 a second cathode connected to the n-type well region, the second source/drain region being disposed between at least a portion of the second cathode and the region of the semiconductor substrate directly under the gate;
a heavily doped p-type region;
a first metal-containing plate over and contacting a first portion of the n-type well region, and over and connected to the first source/drain region, wherein:
 the first metal-containing plate is the first anode of the first Schottky diode;
 the heavily doped p-type region is in contact with the first metal-containing plate, with the first Schottky diode between the heavily doped p-type region and the first source/drain region; and
 the heavily doped p-type region and the first Schottky diode are on a drain side of the PFET; and
a second metal-containing plate over and contacting a second portion of the n-type well region, and over and connected to the second source/drain region, wherein the second metal-containing plate is the second anode of the second Schottky diode, and the n-type well region continuously extends from the first metal-containing plate to the second metal-containing plate.

2. The device of the claim 1 further comprising a charge pump comprising the PFET, the first Schottky diode, and the second Schottky diode therein.

3. The device of the claim 2, wherein the charge pump comprises a Dickson charge pump.

4. The device of the claim 2, wherein the charge pump comprises a plurality of pump cells connected in series and identical to each other, and wherein the PFET, the first Schottky diode, and the second Schottky diode are in one of the plurality of pump cells.

5. The device of the claim 4, wherein the first source/drain region is connected to an output node of the one of the plurality of pump cells, and the second source/drain region is connected to an input node of the one of the plurality of pump cells.

6. The device of the claim 1, wherein each of the first source/drain region and the second source/drain region comprises a heavily-doped p-type region.

7. A device comprising:
a semiconductor substrate;
an n-well region in the semiconductor substrate;
a P-type Field Effect Transistor (PFET) comprising:
 a gate dielectric over n-well region;
 a gate electrode over the gate dielectric;
 a first source/drain region in the n-well region and on a first side of the gate electrode, the first source/drain region being electrically connected to the gate electrode; and
 a second source/drain region in the n-well region and on a second side of the gate electrode, the second source/drain region not being electrically connected to the gate electrode;
a first metal-containing plate over and connected to the first source/drain region, wherein the first metal-containing plate extends over and contacts a first portion of the n-well region to form a first Schottky diode with the n-well region;

a second metal-containing plate over and connected to the second source/drain region, wherein the second metal-containing plate extends over and contacts a second portion of the n-well region to form a second Schottky diode with the n-well region, and wherein the n-well region continuously extends from the first metal-containing plate to the second metal-containing plate; and a heavily doped p-type region contacting the first metal-containing plate, with the first Schottky diode between the heavily doped p-type region and the first source/drain region, wherein the first source/drain region is a drain region of the PFET.

8. The device of claim 7, wherein the first source/drain region comprises a first additional heavily doped p-type region, and wherein the second source/drain region comprises a second additional heavily doped p-type region.

9. The device of claim 8, wherein first and the second metal-containing plates comprise metal silicides, and extend over and contacting the first and the second additional heavily doped p-type regions, respectively.

10. The device of the claim 7 further comprising a charge pump comprising the PFET, the first Schottky diode, and the second Schottky diode therein.

11. The device of the claim 10, wherein the charge pump comprises a Dickson charge pump.

12. The device of the claim 10, wherein the charge pump comprises a plurality of pump cells connected in series and identical to each other, and wherein the PFET, the first Schottky diode, and the second Schottky diode is in one of the plurality of pump cells.

13. The device of claim 7, wherein the n-well region is a body of the PFET.

14. A device comprising:
a charge pump comprising a first pump cell, wherein the first pump cell comprises:
  a capacitor;
  a P-type Field Effect Transistor (PFET), wherein the PFET comprises:
    a gate;
    a first source/drain region in a body region of the PFET and connected to the gate, wherein the first source/drain region comprises a first heavily doped p-type region;
    a second source/drain region in the body region, wherein one of the first and the second source/drain regions is electrically connected to the capacitor, wherein the second source/drain region comprises a second heavily doped p-type region;
  a first Schottky diode comprising:
    a first anode contacting the first source/drain region; and
    a first cathode formed of the body region of the PFET, the first source/drain region being disposed between at least a portion of the first cathode and a region of the body region directly under the gate, wherein the PFET further comprises an additional heavily doped p-type region contacting the first anode, with the first Schottky diode between the additional heavily doped p-type region and the first source/drain region, and the additional heavily doped p-type region and the first Schottky diode are on a drain side of the PFET; and
  a second Schottky diode comprising:
    a second anode contacting the second source/drain region; and
    a second cathode formed of the body region of the PFET, the second source/drain region being disposed between at least a portion of the second cathode and the region of the body region directly under the gate.

15. The device of claim 14, wherein the charge pump further comprises a second pump cell identical to the first pump cell, wherein the first and the second pump cells are connected in series.

16. The device of claim 14, wherein the charge pump further comprises a switch connected to the second source/drain region.

17. The device of claim 14, wherein the first anode comprises a metal-containing plate, and wherein the first cathode comprises a portion of an n-well region, and wherein the portion of the n-well region contacts the metal-containing plate to form the first Schottky diode.

18. The device of claim 17, wherein the metal-containing plate overlaps the first heavily doped p-type region.

19. A device comprising:
a semiconductor substrate;
an n-well region in the semiconductor substrate;
a P-type Field Effect Transistor (PFET) comprising:
  a gate dielectric over n-well region;
  a gate electrode over the gate dielectric;
  a first source/drain region in the n-well region and on a first side of the gate electrode, the first source/drain region being electrically connected to the gate electrode; and
  a second source/drain region in the n-well region and on a second side of the gate electrode, the second source/drain region not being electrically connected to the gate electrode;
a first metal-containing plate over and connected to the first source/drain region, wherein the first metal-containing plate extends over and contacts a first portion of the n-well region to form a first Schottky diode with the n-well region;
a second metal-containing plate over and connected to the second source/drain region, wherein the second metal-containing plate extends over and contacts a second portion of the n-well region to form a second Schottky diode with the n-well region, and wherein the n-well region continuously extends from the first metal-containing plate to the second metal-containing plate;
a first heavily doped p-type region contacting the first metal-containing plate, with the first Schottky diode between the first heavily doped p-type region and the first source/drain region; and
a second heavily doped p-type region contacting the second metal-containing plate, with the second Schottky diode between the second heavily doped p-type region and the second source/drain region.

20. The device of claim 19, wherein each of the first source/drain region and the second source/drain region comprises an additional heavily doped p-type region.

* * * * *